United States Patent
Lee et al.

(10) Patent No.: US 7,123,006 B2
(45) Date of Patent: Oct. 17, 2006

(54) SENSING APPARATUS HAVING FLUXGATE AND CONTROL METHOD THEREOF

(75) Inventors: Woo-jong Lee, Suwon (KR); Sang-on Choi, Suwon (KR); Seung-choul Song, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/658,380

(22) Filed: Sep. 10, 2003

(65) Prior Publication Data

US 2004/0051566 A1    Mar. 18, 2004

(30) Foreign Application Priority Data

Sep. 18, 2002    (KR) ............... 10-2002-0056712

(51) Int. Cl.
*G01R 33/04* (2006.01)
(52) U.S. Cl. .................................... 324/253
(58) Field of Classification Search ........... 324/253, 324/244, 254–263; 327/110, 176, 172
See application file for complete search history.

(56) References Cited

U.S. PATENT DOCUMENTS

| | | | |
|---|---|---|---|
| 4,622,843 A * | 11/1986 | Hormel | 73/1.76 |
| 5,223,821 A * | 6/1993 | Poe et al. | 340/645 |
| 5,333,110 A * | 7/1994 | Al-Attar | 701/207 |
| 5,376,245 A * | 12/1994 | McLeod | 204/155 |
| 5,744,956 A * | 4/1998 | Hawks | 324/253 |
| 5,764,052 A * | 6/1998 | Renger | 324/258 |
| 6,282,803 B1 * | 9/2001 | Dunne | 33/361 |

* cited by examiner

*Primary Examiner*—Edward Lefkowitz
*Assistant Examiner*—David M. Schindler
(74) *Attorney, Agent, or Firm*—Lee & Morse, P.C.

(57) ABSTRACT

In a sensing apparatus, and a control method of a sensing apparatus, the sensing apparatus includes a fluxgate including a driving coil for exciting a magnetic substance core with a current, first and second current amplifiers for applying the current to first and second ends of the driving coil, a pulse generator for generating a pulse to turn on/off the first and second current amplifiers, and a pulse controller for outputting a control signal allowing the pulse to be applied to the first and second current amplifiers, the pulse controller outputting the control signal at a start of a sensing cycle, the fluxgate generating an analog signal due to the excited magnetic substance, and an A/D converter for converting the analog signal from the fluxgate into a digital signal, wherein the pulse controller stops outputting the control signal when the A/D converter outputs the digital signal to the pulse controller.

5 Claims, 4 Drawing Sheets

SENSING APPARATUS HAVING FLUXGATE AND CONTROL METHOD THEREOF

BACKGROUND OF THE INVENTION

1. Field of the Invention

The present invention relates to a fluxgate. More particularly, the present invention relates to a sensing apparatus having a high-efficiency fluxgate and a control method thereof capable of reducing power consumption by minimizing driving current.

2. Background of the Related Art

A fluxgate is a sensor detecting a magnetic field region of the earth. The fluxgate uses a high permeability material such as permalloy as a magnetic substance core for a driving coil to apply an excited magnetic field thereto. The fluxgate also uses magnetic saturation and nonlinear magnetic characteristics of the core to measure a second harmonic component proportionate to an external magnetic field, thereby measuring the size of the external magnetic field.

FIG. 1 illustrates a circuit diagram showing a conventional fluxgate. As shown in FIG. 1, the fluxgate includes a driving coil 40 for generating current to excite a magnetic substance core with current, a pulse generator 10 for generating pulses to be applied to the driving coil 40, amplifiers 30 and 31 for amplifying pulses to be applied to a first end a and a second end b, of the driving coil 40, and an inverter 20 for inverting the pulse applied to the second end b of the driving coil 40 to generate current.

Signals for turning the current amplifiers 30 and 31 on and off are due to a pulse P1 generated from the pulse generator 10. The pulse P1 from the pulse generator 10 is directly transmitted to the current amplifier 30, and is inverted through the inverter 20 to have a reversed phase when transmitted to the current amplifier 31.

Thus, pulse signals P2 and P3 applied to the first and second ends a and b, respectively, of the driving coil 40, which are respectively connected to the amplifiers 30 and 31, have opposite phases. When the pulse signal P2 has a high level q1 at the first end a, and the pulse signal P3 has a low level q2 at the second end b, current flows from a to b along the coil 40. On the other hand, when the pulse signal P2 has a low level at the first end a, and the pulse signal P3 has a high level at the other end b, current flows from b to a along the coil 40. As a result, current is applied to the driving coil 40 in response to the pulse signals, thereby exciting the magnetic substance core on which the driving coil 40 is wound.

To drive the fluxgate, the pulse generator 10 is driven to apply a pulse train to the driving coil 40. Thus, when the fluxgate is driven with the driving coil 40 being driven by the generated pulse train, current flows constantly causing a high current consumption in a unit time interval.

MEMS (Micro-Electro Mechanical System) is a technology implementing mechanical and electrical parts using a semiconductor manufacturing process. A fluxgate may be minimized and integrated using MEMS technology. A fluxgate manufactured by a MEMS manufacturing process for a portable small-size terminal is generally used when there is a limited power source. Therefore, characteristic high current consumption of a fluxgate in a unit time interval can be a significant problem.

SUMMARY OF THE INVENTION

In an effort to solve at least the problems and/or disadvantages described above, it is a feature of an embodiment of the present invention to provide a sensing apparatus having a fluxgate capable of reducing power consumption to drive the fluxgate.

At least one of the above and other features and advantages of the present invention may be realized by providing a sensing apparatus having a fluxgate including a driving coil for exciting a magnetic substance core with a current, first and second current amplifiers for applying the current to first and second ends of the driving coil, a pulse generator for generating a pulse to turn on/off the first and second current amplifiers, and a pulse controller for outputting a control signal allowing the pulse to be applied to the first and second current amplifiers, the pulse controller outputting the control signal at a start of a sensing cycle, the fluxgate generating an analog signal due to the excited magnetic substance, and an A/D converter for converting the analog signal from the fluxgate into a digital signal, wherein the pulse controller stops outputting the control signal when the A/D converter outputs the digital signal to the pulse controller.

The sensing apparatus may further include an AND gate for logical AND-ing the pulse from the pulse generator with the control signal from the pulse controller to send an output signal to the first and second current amplifiers. The pulse controller may output a high level signal during conversion of the analog signal from the fluxgate, and the pulse controller may output a low level signal when the conversion of the analog signal into the digital signal by the A/D converter is complete and the A/D converter outputs the digital signal to the pulse controller. The pulse controller may output the low level signal a predetermined time period after the conversion of the analog signal into the digital signal is complete and the A/D converter outputs the digital signal to the pulse controller.

At least one of the above and other features and advantages of the present invention may be realized by providing a sensing apparatus having a fluxgate including a pulse controller for generating a pulse to block current from flowing into a driving coil of the fluxgate when it is determined that conversion of an analog signal from the fluxgate to a digital signal is completed by an A/D converter and the A/D converter outputs the digital signal to the pulse controller.

At least one of the above and other features and advantages of the present invention may be realized by providing a control method of a sensing apparatus having a driving coil for exciting a magnetic substance core with current, first and second current amplifiers for applying current to first and second ends of the driving coil, respectively, a fluxgate with a pulse generator for generating a pulse to turn on/off the first and second current amplifiers, an A/D converter for converting an analog signal from the fluxgate into a digital signal, and a pulse controller for outputting a control signal for controlling the pulse generator, the control method including a) driving the pulse generator when the fluxgate initiates a drive and outputting a first control signal in order for the pulse generated from the pulse generator to be applied to the first and second current amplifiers, and b) outputting a second control signal in order for the pulse generated from the pulse generator not to be applied to the first and second current amplifiers when the conversion of the analog signal into the digital signal by the A/D converter is complete and the A/D converter outputs the digital signal to the pulse controller.

The control method may further include logical AND-ing in an AND gate in the sensing apparatus the pulse from the pulse generator with the control signal from the pulse controller to send an output signal to the first and second current amplifiers.

In the control method, in a) the pulse controller may output a high level signal as the first control signal to the AND gate, and in b) the pulse controller may output a low level signal as the second control signal to the AND gate.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF PREFERRED EMBODIMENTS

Korean Patent Application No. 2002-56712, filed on Sep. 18, 2002, and entitled: "Sensing Apparatus Having Fluxgate And Control Method Thereof," is incorporated by reference herein in its entirety.

Figure 1:
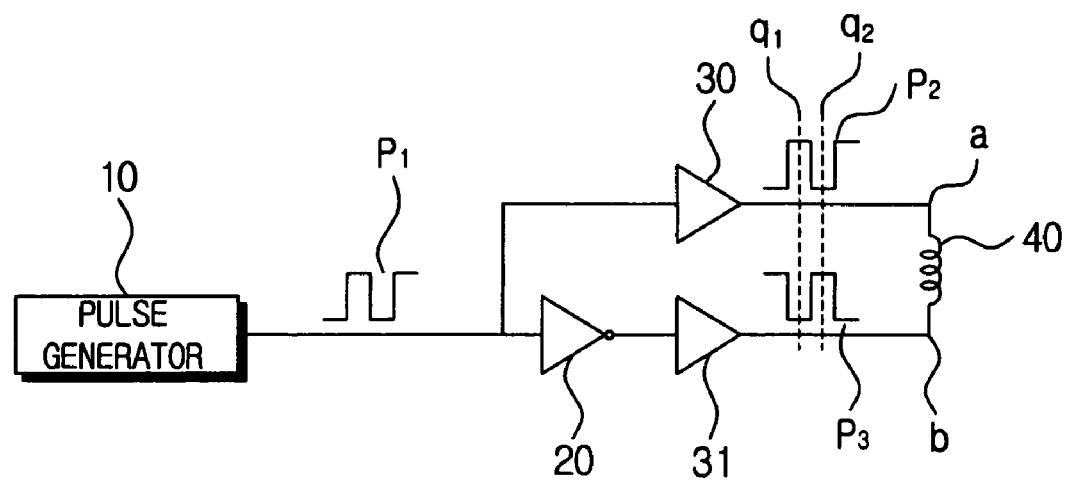
FIG. 1 is a circuit diagram showing a conventional fluxgate.
Figure 2:
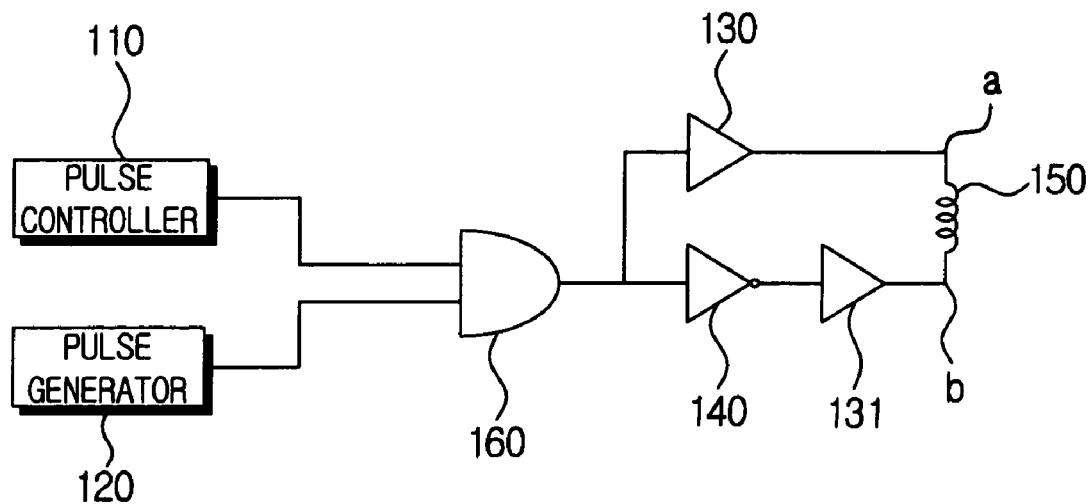
FIG. 2 is a circuit diagram showing a fluxgate according to an embodiment of the present invention.
Figure 3:
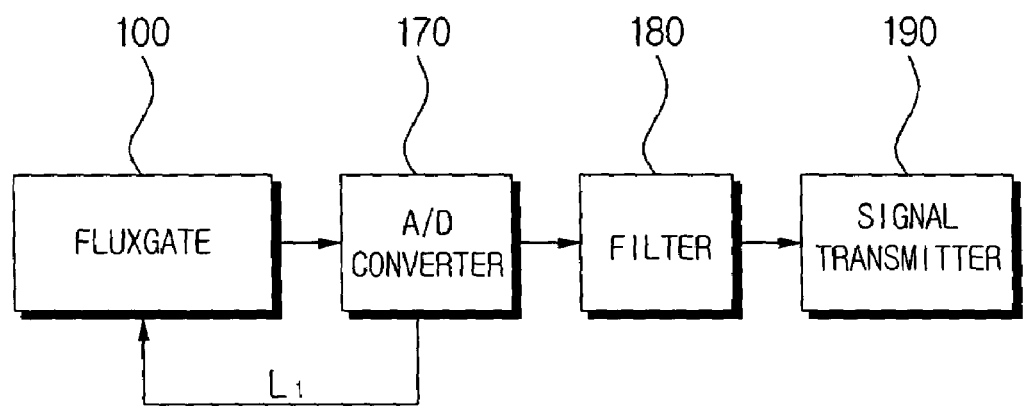
FIG. 3 is a block diagram schematically showing a sensing apparatus having the fluxgate of FIG. 2.

FIG. 2 is a circuit diagram showing a fluxgate according to an embodiment of the present invention, and FIG. 3 is a block diagram schematically showing a sensing apparatus having the fluxgate of FIG. 2. Referring to FIGS. 2 and 3, the sensing apparatus includes a fluxgate 100 for providing an analog sensor signal to an A/D converter 170 to be converted into a digital signal, and to transmit the digital signal to an external system using the analog sensor signal from the fluxgate 100, a filter 180 and a signal transmitter 190. The fluxgate 100 includes a driving coil 150, first and second current amplifiers 130 and 131, an inverter 140, a pulse generator 120, an AND gate 160 and a pulse controller 110.

The driving coil 150 is wound on a magnetic substance core (not shown) to excite the magnetic substance core, on which a sensor coil (not shown) is also wound. The first and second current amplifiers 130 and 131 are connected to first and second ends a and b, respectively, of the driving coil 150 to apply current to the driving coil 150. The inverter 140 is connected to the second current amplifier 131 to invert an input signal and to transmit the inverted signal to the second current amplifier 131. The pulse generator 120 generates a pulse P1 to turn on/off the first and second current amplifiers 130 and 131. The pulse controller 110 outputs a control signal to control the pulse generator 120.

As shown in FIG. 2, the pulse P1 is directly input to the first amplifier 130, and thus current P2 having a same phase as that of the pulse P1 is applied to the first end a of the driving coil 150. The pulse P1 is inverted by the inverter 140 and input to the second amplifier 131, and thus current P3 having an opposite phase to that of the pulse P1 is applied to the second end b of the driving coil 150. Since P2 and P3 are opposite in phase, when a high level signal is input to the first end a of the driving coil 150 as shown by a point $q_1$, and a low level signal is input to the second end b of the driving coil 150, current flows from a to b. When a low level signal is input to the first end a as shown by a point $q_2$, and a high level signal is input to the second end b, current flows from b to a. Since high/low level signals are input in turn with respect to pulses, current is applied to the driving coil 150 to excite the magnetic substance core on which the driving coil 150 is wound.

With the above configuration, the fluxgate 100 senses a magnetic field when the magnetic substance core is sufficiently excited as current flows along the driving coil 150, and then the sensor coil (not shown) outputs an analog sensor signal. The fluxgate 100 further includes an additional analog signal processing circuit (not shown) for processing the output analog sensor signal from the sensor coil. The processed analog sensor signal is converted into a digital signal to be transmitted to other systems using the analog sensor signal.

The analog sensor signal output from the fluxgate 100 is input to the A/D converter 170 to be converted into the digital signal. The A/D converter 170 is connected to the pulse controller 110 of the fluxgate 100 as shown by $L_1$, in order for the pulse controller 110 to detect when conversion of the analog sensor signal into the digital signal is completed. The filter 180 is connected to the A/D converter 170 to filter the digital signal. The signal transmitter 190 is connected to the filter 180 to transmit the filtered signal to the other systems using the sensor signal from the fluxgate 100. The sensor signal from the fluxgate 100 is interfaced through the signal transmitter 190.

With the above configuration, the fluxgate 100 of the sensing apparatus applies current to the driving coil 150 only while the sensor signal is A/D converted by the A/D converter 170 during one driving cycle of the sensing apparatus. To this end, the pulse to turn on/off the first and second current amplifiers 130 and 131 that apply current to the first and second ends of the driving coil 150 is input to the first and second current amplifiers 130 and 131 only during the A/D conversion.

Figure 4:
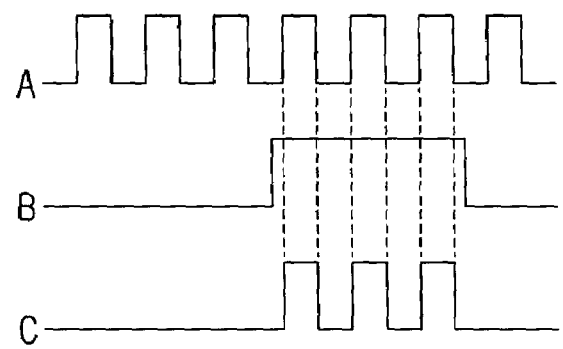
FIG. 4 illustrates waveforms of control signals applied to the fluxgate of FIG. 3 and a pulse controller.
Figure 4:
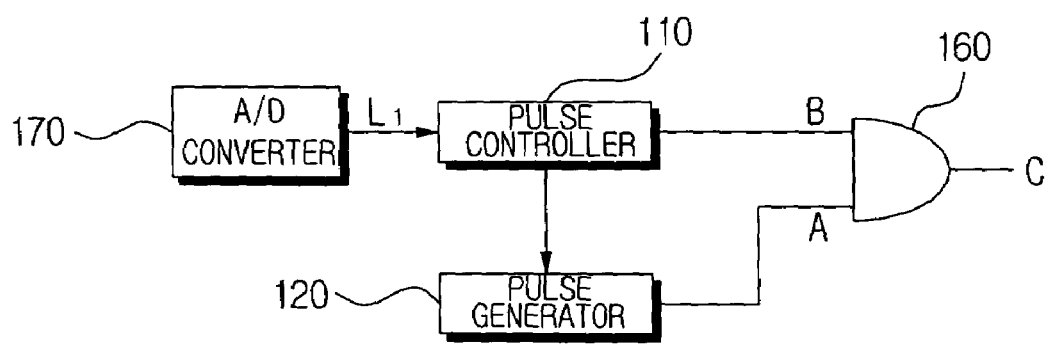

A detailed description of a control signal for pulse control according to an embodiment of the present invention will be presented hereinafter with reference to FIG. 4. FIG. 4 shows waveforms of signals for pulse control and a block diagram including the pulse controller 110. As shown in FIG. 4, a pulse A generated from the pulse generator 120 and a control signal B outputted from the pulse controller 110 are input to the AND gate 160. The AND gate 160 logical ANDs the control signal B and the pulse A to output a signal C to the first and second current amplifiers 130 and 131.

For the fluxgate 100 to initiate a drive, the pulse controller 110 inputs a driving signal to the pulse generator 120 to generate a pulse such as A, and begins to input a high level signal as a control signal B to the AND gate 160. The pulse A generated from the pulse generator 120 and the control signal B from the pulse controller 110 are logical AND-ed to output a signal C only while the control signal B is a high level signal.

The pulse controller 110 is connected to the A/D converter 170, shown by $L_1$, to determine whether the A/D conversion is complete in response to an input signal from the AD converter 170. When the pulse controller 110 determines that the A/D conversion is complete, the control signal B to the AND gate 160 is converted to a low level signal. Upon inputting of the low level signal to the AND gate 160, the AND gate 160 does not output a pulse so that the current amplifiers 130 and 131 are turned off, and current is not applied to the driving coil 150.

Figure 5:
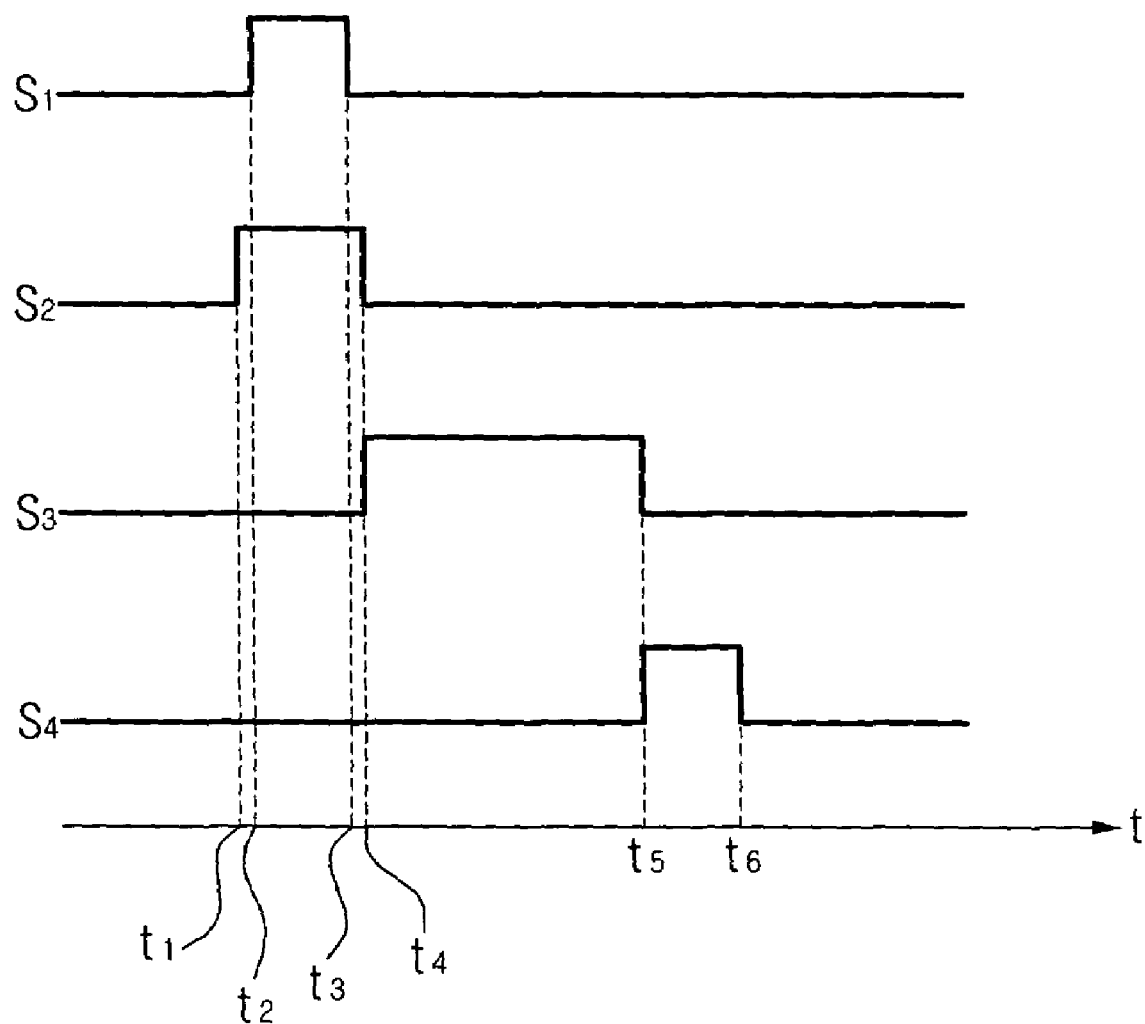
FIG. 5 is a waveform diagram illustrating an operation of the sensing apparatus of FIG. 3.

Operation of the sensing apparatus for controlling pulses according to an embodiment of the present invention will be described hereinafter with reference to FIGS. 5 and 6. FIG. 5 illustrates waveforms of one cycle of the sensing apparatus, wherein $S_1$ represents an 'Enable' signal of the A/D converter 170, $S_2$ represents a control signal, such as control signal B, of the pulse controller 110, $S_3$ represents a filtered 'Enable' signal filtered by the filter 180 and $S_4$ represents a signal transmission 'Enable' signal outputted from the signal transmitter 190 after being processed, all with respect to a time axis t.

Figure 6:
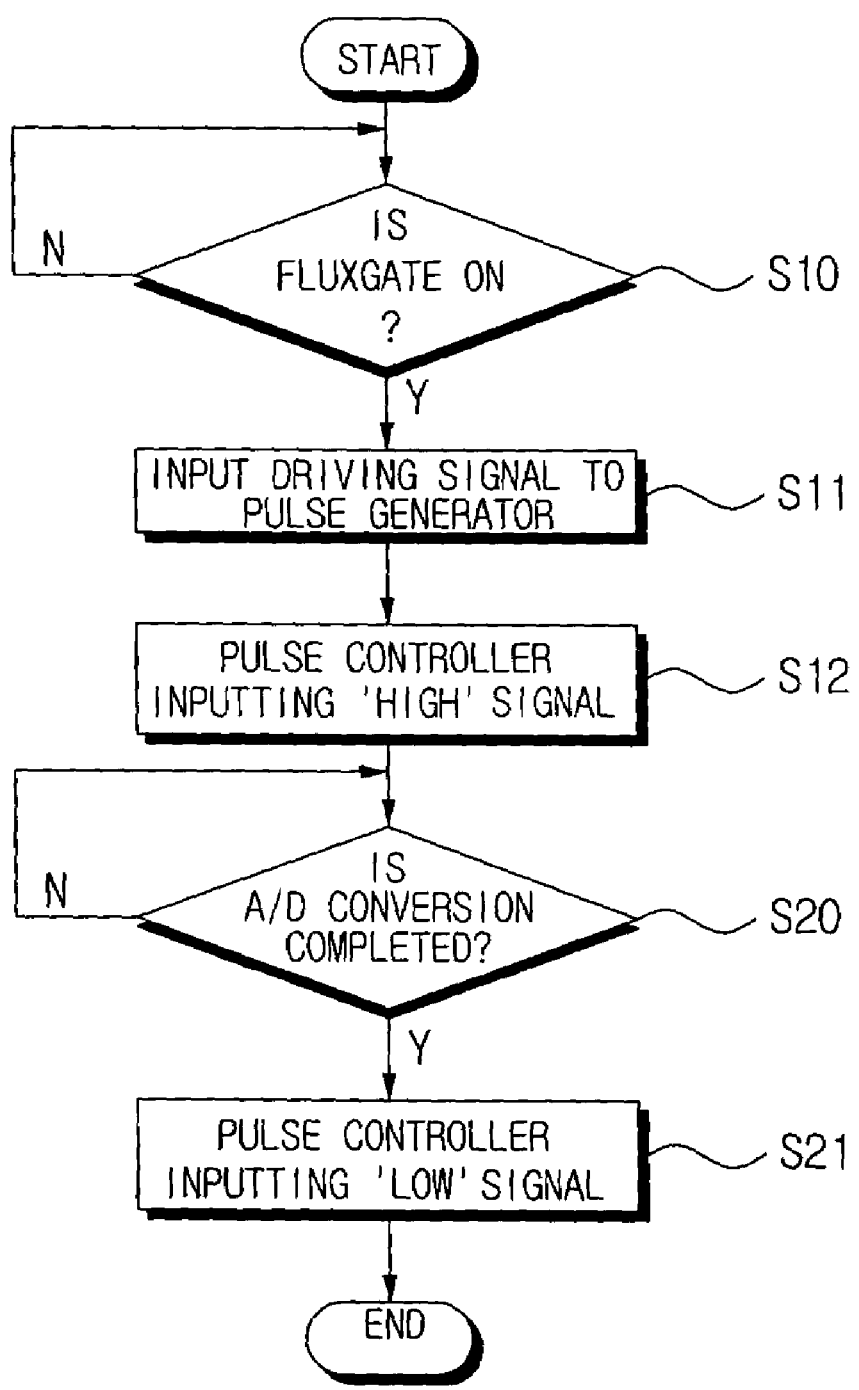
FIG. 6 is a flow chart illustrating a control method of a sensing apparatus according to an embodiment of the present invention.

FIG. 6 shows a flow chart of a control method of the present invention. With respect to FIGS. 3–6, upon determining that the fluxgate 100 initiates a drive (S10), the pulse controller 110 inputs a driving signal to the pulse generator 120 to generate a pulse (S11), and inputs a high level signal, such as $S_2$, as a control signal B to the AND gate 160 (S12). During the inputting of the high level signal as the control signal B, the AND gate 160 outputs a pulse to the first and second current amplifiers 130 and 131. During the inputting of the pulse to the first and second current amplifiers 130 and 131, the driving coil 150 drives, and thus the fluxgate outputs an analog sensor signal. The analog sensor signal is input to the A/D converter 170 to be converted into a digital signal. That is, a high level control signal such as $S_2$ is input to the AND gate 160 at $t_1$, and an analog sensor signal such as $S_1$ is outputted from the fluxgate 100 and input to the A/D converter 170, where it is converted into a digital signal at $t_2$.

When the A/D conversion is completed at $t_3$ (S20), the pulse controller 110 detects the completion, and inputs a low level signal as a control signal B, such as $S_2$, to the AND gate 160 at $t_4$ (S21). The converted digital signal shown as $S_3$ is input to the filter 180 to be filtered at $t_4$. When the filtering is complete, the filtered signal shown as $S_4$ is input to the signal transmitter 190 at $t_5$ to be transmitted to external systems.

With the present control method, current for driving the driving coil of the fluxgate during one cycle begins flowing when the fluxgate 100 initiates a drive, and continues to flow until it is decided that conversion of the sensor signal from the fluxgate 100 by the A/D converter 170 is complete.

Namely, when the A/D conversion of the sensor signal from the fluxgate 100 is completed by the A/D converter 170, the control signal B from the pulse controller 110 is converted to a low level signal. Since the control signal B being input to the AND gate 160 is now a low level signal, the pulse is blocked from being input to the first and second current amplifiers 130 and 131, and current is not applied to the driving coil 150. Therefore, an amount of current applied to drive the fluxgate is reduced.

An example of a reduction in the current necessary to drive the fluxgate that is possible by the present invention is as follows: if one cycle of the sensing apparatus is 5 ms long, an actual driving time of the coil is reduced to about 20 µs. In such a case, if power consumption of the conventional fluxgate is 100 when current is continuously applied to the driving coil during one cycle, the power consumption of the fluxgate according to the present invention is reduced to 0.4, or 40% of the power consumption of the conventional fluxgate.

With the sensing apparatus having the fluxgate according to the present invention, an amount of current required to drive the fluxgate may be sharply reduced, so that power consumption of the whole sensing apparatus may also be reduced.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A sensing apparatus comprising:
   a fluxgate including
      a driving coil for exciting a magnetic substance core with a current,
      first and second current amplifiers for applying the current to first and second ends of the driving coil,
      a pulse generator for generating a pulse to turn on/off the first and second current amplifiers,
      a pulse controller for outputting a control signal allowing the pulse to be applied to the first and second current amplifiers, the pulse controller outputting the control signal at a start of a sensing cycle, the fluxgate generating an analog signal due to the excited magnetic substance;
   an A/D converter for converting the analog signal from the fluxgate into a digital signal, wherein the pulse controller stops outputting the control signal when the A/D converter outputs the digital signal to the pulse controller; and
   an AND gate for logical AND-ing the pulse from the pulse generator with the control signal from the pulse controller and for outputting an output signal to the first and second current amplifiers in accordance with the logical AND-ing.

2. The sensing apparatus as claimed in claim 1, wherein the pulse controller outputs a high level signal during conversion of the analog signal from the fluxgate, and the pulse controller outputs a low level signal when the conversion of the analog signal into the digital signal by the A/D converter is complete and the A/D converter outputs the digital signal to the pulse controller.

3. The sensing apparatus as claimed in claim 2, wherein the pulse controller outputs the low level signal a predetermined time period after the conversion of the analog signal into the digital signal is complete and the A/D converter outputs the digital signal to the pulse controller.

4. A control method of a sensing apparatus having a driving coil for exciting a magnetic substance core with a current; first and second current amplifiers for applying current to first and second ends of the driving coil, respectively; a fluxgate with a pulse generator for generating a pulse to turn on/off the first and second current amplifiers; an A/D converter for converting an analog signal from the fluxgate into a digital signal; and a pulse controller for outputting a control signal for controlling the pulse generator, the control method comprising:

a) driving the pulse generator when the fluxgate initiates a drive and outputting a first control signal in order for the pulse generated from the pulse generator to be applied to the first and second current amplifiers;

b) outputting a second control signal in order for the pulse generated from the pulse generator not to be applied to the first and second current amplifiers when the conversion of the analog signal into the digital signal by the A/D converter is complete and the A/D converter outputs the digital signal to the pulse controller; and logical AND-ing the pulse from the pulse generator with the control signal from the pulse controller and outputting an output signal to the first and second current amplifiers in accordance with the logical AND-ing.

5. The control method as claimed in claim 4, wherein in a) the pulse controller outputs a high level signal as the first control signal, and in b) the pulse controller outputs a low level signal as the second control signal.

* * * * *